United States Patent [19]

Morikawa et al.

[11] Patent Number: 5,006,167
[45] Date of Patent: Apr. 9, 1991

[54] METALLIZING COMPOSITION

[75] Inventors: Asao Morikawa; Kazuo Kondo, both of Aichi, Japan

[73] Assignee: NGK Spark Plug Co., Ltd., Aichi, Japan

[21] Appl. No.: 301,291

[22] Filed: Jan. 25, 1989

[30] Foreign Application Priority Data

Jan. 25, 1988 [JP] Japan .................. 63-12670

[51] Int. Cl.$^5$ .............................................. C23C 30/00
[52] U.S. Cl. ........................ 106/1.18; 106/902; 501/17; 501/19; 501/21; 524/439
[58] Field of Search ............ 106/1.14, 1.13, 1.18; 501/17, 19, 21; 524/439; 252/514

[56] References Cited

U.S. PATENT DOCUMENTS

| 3,776,769 | 12/1973 | Buck | 252/514 |
|---|---|---|---|
| 3,799,890 | 3/1974 | Smith | 252/514 |
| 3,838,071 | 9/1974 | Amin et al. | 106/1.14 |
| 3,962,143 | 6/1976 | Hitch | 252/518 |
| 4,098,949 | 7/1978 | Kosiorek | 252/514 |
| 4,230,493 | 10/1980 | Felton | 106/1.18 |
| 4,507,392 | 3/1985 | Rittler | 501/21 |

FOREIGN PATENT DOCUMENTS

| 53-33752 | 9/1979 | Japan | 109/1.14 |
|---|---|---|---|
| 59-164686 | 9/1984 | Japan | 109/1.13 |

OTHER PUBLICATIONS

"Electrode with Improved Adhesion" Milkovich et al. 10 Mar. 66.

Primary Examiner—Theodore Morris
Attorney, Agent, or Firm—Sughrue, Mion, Zinn, Macpeak & Seas

[57] ABSTRACT

A metallizing composition is described that comprises 100 parts by weight of Au powder, from 2 to 7 parts by weight of CuO powder, from 0.3 to 2 parts by weight of a glass-based inorganic powder free from PbO, and from 3 to 8 parts by weight of a resin.

9 Claims, 1 Drawing Sheet

METALLIZING COMPOSITION

BACKGROUND OF THE INVENTION

The present invention relates to a metallizing composition suitable for use with electronic parts such as ceramic packages, ceramic multi-layered substrates, transistor packages, rectifier containers, ceramic tubes for vacuum circuit breakers and terminal bushings that employ low-temperature firing ceramics and noble-metal based metallizing composition, either alone or in combination with Cu-based metallizing composition.

With the recent tendency in the IC (integrated circuit) industry to increase the packing density of IC packages, multi-layered circuit boards, etc., to a very high level, a demand has arisen for commercialization of low-dielectric constant ceramics and low-resistance conductors.

It has been known in this field of art to use metallizing compositions of noble metals including Au, Au-Pt alloy, Ag-Pt alloy and Ag-Pd alloy, and they have the advantage of being firable in air atmosphere. On the other hand, however, the metallizing composition of these noble metals is costly.

In contrast, Cu-based metallizing composition is comparatively inexpensive and has recently come to be used in ceramic circuit boards by virtue of the added advantage of high electroconductivity. The major problem, however, with Cu-based metallizing composition is that it is very difficult to achieve complete combustion of the organic components in the metallizing composition without oxidizing Cu. If Cu is oxidized to form CuO, the conductivity and solderability of the metallizing composition are reduced. If some measure is taken to prevent the formation of CuO, the organic components will remain partly unburnt. The measure for preventing the formation of CuO is described, for example, in JP-A-55-128899 (The term "JP-A" as used herein means an "unexamined published Japanese patent application".), wherein a firing atmosphere is a neutral or reducing one, because the firing in air atmosphere makes Cu oxidize to form CuO according to a reaction formula: $2Cu + O_2 \rightarrow CuO$.

Under these circumstances, the usual practice taken for noble-metal based metallizing composition is to simply fire it in air atmosphere, whereas Cu-based metallizing composition is calcined in air atmosphere at 500° to 700° C. so as to burn away the resin content, and thereafter, CuO that has been formed by oxidation is converted to Cu by treatment in a reducing atmosphere at 400° to 600° C., followed by final firing in non-oxidizing atmosphere. Therefore, in view of the differences in firing conditions between noble-metal based metallizing compositions and Cu-based metallizing compositions, it has been theoretically impossible to use the two types of metallizing compositions simultaneously in the same electronic part (or product).

As another problem, commercial noble-metal (e.g., Au) based metallizing composition typically contains lead borosilicate glass, so if it is fired in a non-oxidizing atmosphere, PbO in the glass is reduced to a metallic lead. Since the metallic lead causes such adverse effects as deterioration of the other glass components, the desired adhesion to a substrate cannot be sufficiently retained to justify the use of the noble-metal based metallizing composition in commercial applications.

Cu-based metallized packages are currently under development and Cu-based wire bonding techniques and die attach (D/A) techniques are not yet to be established. Under this situation, there is a recognized need for applying noble-metal based metallizing composition to those areas where bonding or D/A is to be performed.

SUMMARY OF THE INVENTION

The present invention has been accomplished as a result of extensive efforts of the present inventors to solve the aforementioned problems of the prior art. An object, therefore, of the present invention, is to provide a metallizing composition that can be fired in a non-oxidizing atmosphere without causing any unwanted problems such as deterioration of the glass components while ensuring satisfactory adhesion to a substrate.

It has now been found that this object of the present invention can be attained by a metallizing composition that contains 100 parts by weight of Au powder, from 2 to 7, preferably from 3 to 5, parts by weight of CuO powder, from 0.3 to 2, preferably from 1 to 2, parts by weight of a glass-based inorganic powder free from PbO and from 3 to 8, preferably from 4 to 6, parts by weight of a resin.

DETAILED DESCRIPTION OF THE INVENTION

Figure 1:
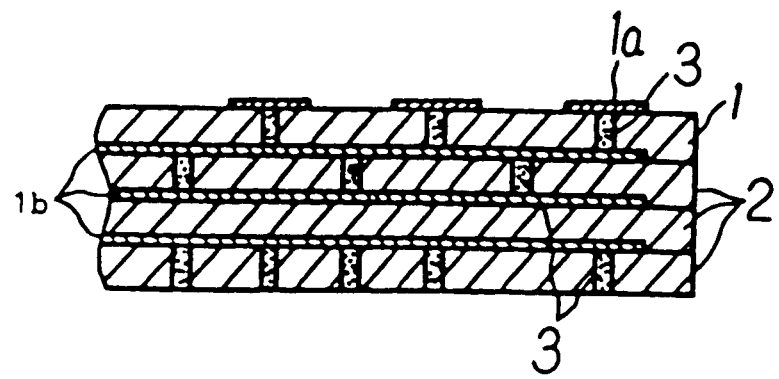
FIG. 1 is a cross sectional view of part of a multi-layered substrate using the Au-based metallizing composition of the present invention.

The specific examples of the glass-based inorganic powder include a borosilicate glass powder and those described in JP-B-63-31422, JP-B-63-31420, JP-B-63-6499, JP-B-63-6503, with the more specific examples including a borosilicate glass powder and those having Composition A, B or C shown in the following table.

| | Composition (wt %) | | |
|---|---|---|---|
| | A* | B** | C*** |
| $SiO_2$ | 57–63 | 40–52 | 55–63 |
| $Al_2O_3$ | 20–28 | 27–37 | 20–28 |
| $MgO$ | 10–18 | 11–13 | 10–20 |
| $ZnO$ | 2–6 | — | — |
| $Y_2O_3$ | — | — | 1–8 |
| $B_2O_3$ | 0.1–6 | 2–8 | 0.1–5 |
| $P_2O_5$ | 0.1–6 | — | 0.1–5 |
| $CaO$ | — | 2–8 | — |
| $ZrO_2$ | — | 0.1–3 | — |

*a composition described in JP-B-63-31422
**a composition described in JP-B-63-31420
***a composition described in JP-B-63-6499

The specific examples of the resin include polyvinyl butyral, a butyral resin, an acrylic resin, cellulose, vinyl acetate, etc.

Three samples of Au-based metallizing compositions in accordance with the present invention were prepared, with the proportions of their components being varied as shown in Table 1 below. The strength of adhesion of each sample and its hermeticity were examined.

As a comparative sample, a metallizing composition that was outside the compositional range of the present invention was used and its strength of adhesion and hermeticity were checked. The results are also shown in Table 1.

The substrates to which the four samples of metallizing composition were applied were in the form of a low-temperature firing ceramic sheet that had the following composition:
- $SiO_2$: 58 wt%
- $Al_2O_3$: 23 wt%
- MgO: 13 wt%
- ZnO: 4 wt%
- $B_2O_3$: 1 wt%
- $P_2O_5$: 1 wt%

(This composition is described in JP-B-63-31422, Example 5 (The term "JP-B" as used herein means an "examined Japanese patent publication").)

TABLE 1

| Sample No. | Composition | | | | Strength of adhesion (kg/1.6 mm × 1.6 mm) | Hermeticity |
|---|---|---|---|---|---|---|
| | Au powder (1.5 μm) | CuO powder (1.5 μm) | glass-based inorganic powder (ca. 1.5 μm) | resin | | |
| 1 | 100 | 5 | 0.5 | 3 | 1.80 2.55 1.70 2.00 | ≦1 × 10⁻⁸ Std cc/sec |
| 2 | 100 | 3 | 1 | 3 | 1.90 1.15 1.15 1.55 | |
| 3 | 100 | 3 | 0.5 | 3 | 2.40 2.00 2.15 2.60 | |
| Comparative sample | commercial Au metallizing composition containing lead borosilicate glass powder | | | | 0 | unable to hold 1 × 10⁻⁸ Std cc/sec |

Note.
The glass-based inorganic powder has the same composition as the low-temperature firing ceramic sheet
The resin is polyvinyl butyral.

The strength of adhesion of each sample was four times tested by the following method: a Cu wire (0.6 mmφ) was bonded to a selected area (1.6 mm × 1.6 mm) of the metallized pattern with In/Pb (50/50) solder and was thereafter pulled up vertically with increasing force until it totally separated from the metallized pattern. Hermeticity was measured with a He detector.

The data given in Table 1 shows that the Au-based metallizing composition of the present invention exhibits high strength of adhesion and hermeticity.

The improvement in the strength of adhesion that is achieved by the Au-based metallizing composition of the present invention is thought to result from the diffusion of CuO into the ceramic matrix, which led to increased adhesion between the metallized layer and the ceramic matrix.

In another aspect, the metallizing composition of the present invention is based on Au powder, which contributes to enhanced hermeticity. By using this Au-based metallizing composition to form a metallized layer on a multi-layered substrate, a fine pattern can be printed on its topmost surface by virtue of the ability of Au-based metallizing composition to allow printing of fine lines; at the same time, the oxidation of a Cu-based metallized layer forming an inner pattern can be prevented without compromising the bondability of conductor wires.

If the Au-based metallizing composition of the present invention is applied to the surface of a multi-layered substrate whereas Cu-based metallizing composition is applied to inner layers, the features of the two types of metallizing compositions can be effectively combined by using a composition of Pt-Cu alloy or Pd-Cu alloy in areas where attack by solder is anticipated and by interposing a composition of Pt, Pd, Ni, etc., in the area of junction between the Au-based metallizing layer and Cu-based metallized layer.

In other words, the Au-based metallizing composition of the present invention has such high thixotropy that it provides greater ease in printing a fine circuit pattern than conventional metal metallizing produced by the screen-printing method. Conventionally, evaporation and etching techniques have been employed to form a patterned layer, so replacement of this conventional method by screen printing will contribute to a significantly simplified process of manufacture.

If the area where Au-based metallizing composition and Cu-based metallizing composition are connected is fired, balls of Au-Cu alloy form, to cause potential interruption of electrical conduction. However, if Pd-Cu alloy or Pt-Cu alloy composition or metallic Pt, Pd or Ni composition or the like is interposed, Au is prevented from connecting directly to Cu, thereby ensuring that electrical conduction will not be interrupted by interspersion of molten balls of Au-Cu alloy.

A specific example of this approach is illustrated in FIG. 1, which is a cross section of part of a multi-layered substrate using the Au-based metallizing composition of the present invention. As shown, a layer of the Au-based metallizing composition 1a of the present invention is formed on the surface of the topmost layer of the substrate 1, a layer of Cu metallizing composition 1b is formed on each of the inner layers of the substrate 2, and Pt-Cu alloy, Pd-Cu alloy, Pt, Pd or Ni composition is placed in through-holes 3 to provide interconnection between the Au and Cu metallized layers. This is effective in preventing the formation of Au-Cu alloy.

Figure 2:
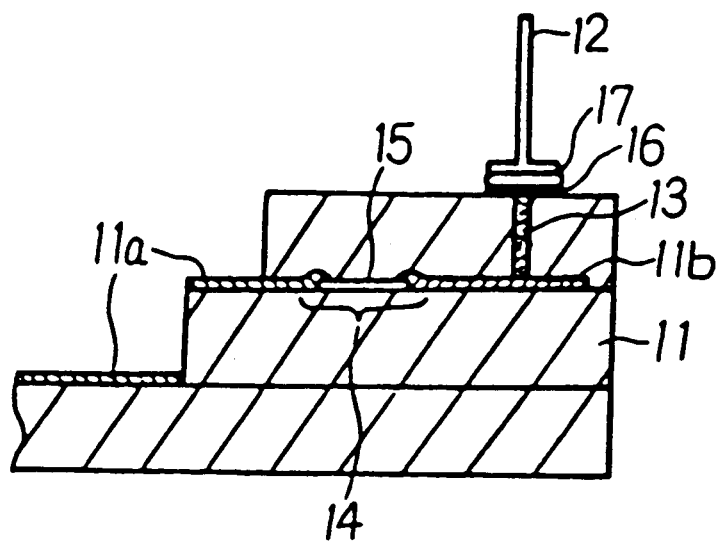
FIG. 2 is a cross sectional view of part of another multi-layered substrate using the Au-based metallizing composition of the present invention.

Another example of the method for preventing the formation of Au-Cu alloy is depicted in FIG. 2, which is a section of part of another multi-layered substrate using the Au-based metallizing composition of the present invention. As shown, a layer of the Au-based metallizing composition 11a is formed on the exposed areas of a stepped substrate 11, a layer of Cu metallizing composition 11b is formed on the inner portion of the substrate, a Pt metallized pattern 16 is formed on the topmost surface of the substrate, and a pin 12 of 42 Alloy (an alloy consisting of 42 wt% of Ni and the remainder of Fe) is joined to that pattern 16 by pure Ag solder 17. A through-hole 13 connecting the soldered area and the Cu metallized layer 11b is filled with Pt-Cu alloy, Pd-Cu alloy, Pt, Pd or Ni composition, and the Au-based metallized layer 11a is joined to the Cu metallized layer 11b by way of an area 14 which is covered with Pt, Pd or Ni composition 15.

Using the Au-based metallizing composition of the present invention, a ceramic substrate can be produced by either sheet lamination or printing lamination, which are shown schematically in the following flow chart.

Whichever method is employed, the Au-based metallizing composition of the present invention is applied to the exposed areas of the substrate whereas Cu-based metallizing composition is formed on the inner portions in such a way that a multi-layered substrate having improved strength of adhesion and hermeticity can be fabricated with reduced cost.

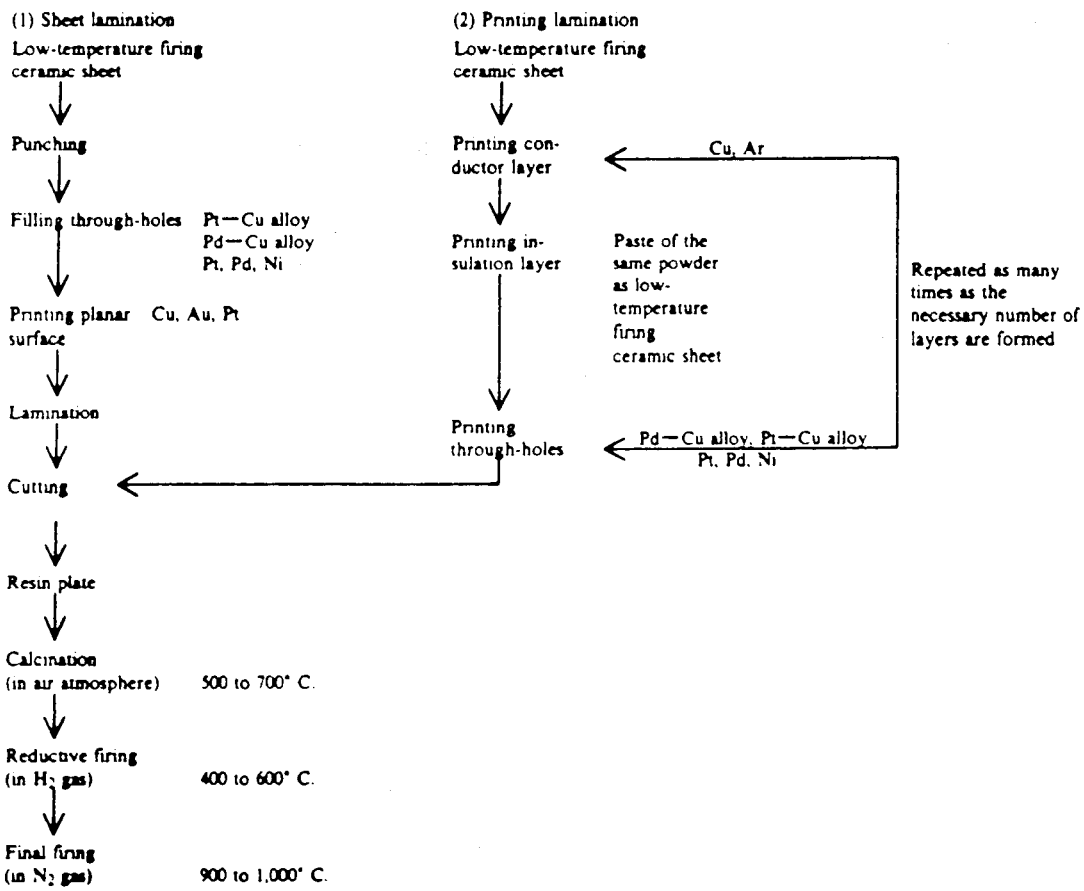

The Au-based metallizing composition of the present invention is resistant to oxidation, has good adhesion to a ceramic substrate, and ensures high hermeticity. Therefore, by applying Cu-based metallizing composition to inner layers of a multi-layered ceramic substrate with the Au-based metallizing composition of the present invention applied to the outermost layer of the substrate, a metallized substrate, package, transistor package, rectifier container, ceramic tube for vacuum circuit breaker or terminal bushing that has good overall characteristics, particularly high reliability, can be produced with the inner Cu-based metallized layer being protected against oxidation.

While the invention has been described in detail and with reference to specific embodiments thereof, it will be apparent to one skilled in the art that various changes and modifications can be made therein without departing from the spirit and scope therof.

What is claimed is:

1. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin.

2. The metallizing composition as claimed in claim 1, wherein the amount of said CuO powder is from 3 to 5 parts by weight.

3. The metallizing composition as claimed in claim 1, wherein the amount of said glass-based inorganic powder is from 1 to 2 parts by weight.

4. The metallizing composition as claimed in claim 1, wherein the amount of said resin is from 4 to 6 parts by weight.

5. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin, wherein said glass-based inorganic powder consists of from 57 to 63% by weight of $SiO_2$, from 20 to 28% by weight of $Al_2O_3$, from 10 to 18% by weight of MgO, from 2 to 6% by weight of ZnO, from 0.1 to 6% by weight of $B_2O_3$ and from 0.1 to 6% by weight of $P_2O_5$.

6. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin, wherein said glass-based inorganic powder consists of from 40 to 52% by weight of $SiO_2$, from 27 to 37% by weight of $Al_2O_3$, from 11 to 13% by weight of MgO, from 2 to 8% by weight of $B_2O_3$, from 2 to 8% by weight of CaO and from 0.1 to 3% by weight of $ZrO_2$.

7. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin, wherein said glass-based inorganic powder consists of from 55 to 63% by weight of $SiO_2$, from 20 to 28% by weight of $Al_2O_3$, from 10 to 20% by weight of MgO, from 1 to 8% by weight of $Y_2O_3$, from 0.1 to 5% by weight of $B_2O_3$ and from 0.1 to 5% by weight of $P_2O_5$.

8. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin, wherein said glass-based inorganic powder is a borosilicate glass powder.

9. A metallizing composition that comprises 100 parts by weight of Au powder, from 2 to 7 parts by weight of CuO powder, from 0.3 to 2 parts by weight of a glass-based inorganic powder free from PbO, and from 3 to 8 parts by weight of a resin, wherein said glass-based inorganic powder is selected from the group consisting of at least one of (a) a glass-based inorganic powder consisting of from 57 to 63% by weight of $SiO_2$, from 20 to 28% by weight of $Al_2O_3$, from 10 to 18% by weight of MgO, from 2 to 6% by weight of ZnO, from 0.1 to 6% by weight of $B_2O_3$ from 0.1 to 6% by weight of $P_2O_5$; (b) a glass-based inorganic powder consisting of from 40 to 52% by weight of $SiO_2$, from 27 37% by weight $Al_2O_3$, from 11 to 13% by weight of MgO, from 2 to 8% by weight of $B_2O_3$, from 2 to 8% by weight of CaO and from 0.1 to 3% by weight of $ZrO_2$; (c) a glass-based inorganic powder consisting of from 55 to 63% by weight of $SiO_2$, from 20 to 28% by weight of $Al_2O_3$, from 10 to 20% by weight of MgO, from 1 to 8% by weight of $Y_2O_3$, from 0.1 to 5% by weight of $B_2O_3$ and from 0.1 to 5% by weight of $P_2O_5$; and (d) a borosilicate glass powder.

* * * * *